US005579262A

United States Patent [19]

Song

[11] Patent Number: 5,579,262
[45] Date of Patent: Nov. 26, 1996

[54] PROGRAM VERIFY AND ERASE VERIFY CONTROL CIRCUIT FOR EPROM/FLASH

[75] Inventor: Paul J. Song, Sunnyvale, Calif.

[73] Assignee: Integrated Silicon Solution, Inc., Sunnyvale, Calif.

[21] Appl. No.: 596,505

[22] Filed: Feb. 5, 1996

[51] Int. Cl.$^6$ .................................................. G11C 13/00
[52] U.S. Cl. ................................ 365/185.33; 365/189.01
[58] Field of Search ........................ 365/185.33, 189.01, 365/230.01

[56] References Cited

U.S. PATENT DOCUMENTS 4,875,188 10/1989 Jungroth .
5,365,484 11/1994 Cleveland et al. ................. 365/185.33

*Primary Examiner*—Terrell W. Fears
*Attorney, Agent, or Firm*—Flehr, Hohbach, Test, Albritton & Herbert

[57] ABSTRACT

A program verify and erase verify control circuit is disclosed for use with an EEPROM/flash memory system wherein each memory cell can be read, erased or programmed based, in part, on the voltage level of a word line coupled to the gate of each of the memory cells. Program operations are verified by placing a worst case (i.e., highest) read voltage on the word lines of programmed memory cells. Similarly, erase operations are verified by placing a worst case (i.e., lowest) read voltage on the word lines of erased memory cells. So that there worst case voltages are stable and reproducible, they are generated using a feedback control circuit consisting of a comparator driven by a bandgap voltage reference (+1.28 VDC ), various feedback transistors and a voltage divider network. The worst case program verification voltage (+6.4 VDC) and the worst case erase verification voltage (+4.0 VDC) are selectively generated by the disclosed circuitry in response to program verify (PV) and erase verify (EV) signals generated by the host computer in which the memory system is installed. The host issues these signals, which initiate a verification operation, following each erase or program operation. If based on the cells' responses when stimulated by the worst case verification voltages it turns out that a program or erase operation was ineffective, the host repeats the memory operation until it is verified to be effective.

17 Claims, 4 Drawing Sheets

5,579,262

PROGRAM VERIFY AND ERASE VERIFY CONTROL CIRCUIT FOR EPROM/FLASH

The present invention relates generally to semiconductor flash memory systems, and more specifically to providing on-chip control circuitry to verify the quality of prior program and erase operations for such memory systems.

BACKGROUND OF THE INVENTION

Solid state and so-called flash memories are known in the art. An individual flash memory cell includes a metal-oxide-semiconductor ("MOS") device having spaced-apart drain and source regions fabricated on a substrate and defining a channel region therebetween. A very thin gate oxide layer overlies the channel region, and a floating charge-retaining storage gate overlies the channel region and is unconnected to the cell. A control gate at least partially overlies the floating gate and is insulated therefrom.

In practice, a plurality of such memory cells is arrayed in addressable rows and columns to form a flash memory array. Individual cells in the array are accessed for purposes of writing, reading or erasing data by decoding row and column information.

Typically, the control gates for a group of cells in a given row are formed from a continuous strip of conductive material that defines a so-called word line, abbreviated "WL". A word line might comprise, for example, a group of eight cells that collectively store one byte. For a given column in the array, the drain leads of all cells in the column are coupled to a so-called bit line, abbreviated "BL". The source leads of the various cells are collectively switchably coupled to one of several potential levels, depending upon whether cells in the array are to be programmed (written) or erased or are to be read.

Within the memory array, an individual cell is addressed and thus selected for reading, programming (writing) or erasing by specifying its row (or word line) as an x-axis coordinate, and its column (or bit line) as a y-axis coordinate. A 16 K-bit memory, for example, may comprise an array of 128×128 bits, in which there are 128 x-axis word lines and 128 y-axis bit lines. Commonly, blocks of memory cells are collectively grouped into sectors. Cell addressing is accomplished by coupling address bits to precoding x-decoders and to precoding y-decoders whose respective outputs are coupled to word lines and bit lines in the array.

Programming an addressed MOS memory cell occurs in a program mode by accelerating so-called hot electrons (from the device substrate). These electrons are injected from the drain region through the thin gate oxide and onto the floating gate. The control gate-source threshold voltage required before substantial MOS device drain-source current occurs is affected by the amount of such charge retained on the floating gate. Thus, storage cell programming forces the floating storage gate to retain charge that will cause the cell to indicate storage of either a logical "1" or "0" in a read-out mode.

The above-described storage cells are non-volatile in that the charge on the storage gate, and thus the "0" or "1" bit stored in the cell, remains even when control and operating voltages to the array are turned off. In the program (write) mode, the control gate is coupled to a high positive potential of perhaps +10 VDC, the drain is coupled to perhaps +6 VDC, and the source and substrate are grounded (meaning that they are coupled to the circuit ground node). This causes the hot electrons to be generated and captured by the floating gate.

In a read mode, the charge stored on the floating gate of an addressed MOS memory cell is read by coupling perhaps +5 VDC to the control gate, and reading drain-to-source current. The presence or absence of charge on the stored gate will define a binary "1" or "0" bit that is read-out from the addressed memory cell by a sense amplifier coupled to the bit line.

In an erase mode, the electrons trapped on the floating gates of a group of addressed MOS memory cells are encouraged to flow by electron tunneling to the source. During this erase mode, a group of negative erase word line decoders cause the addressed cells' control gates to be coupled to perhaps −9 VDC, the sources to perhaps +5 VDC, the drains to float, with the substrates being grounded. In a flash memory configuration, entire sector-sized blocks of cells may be simultaneously erased, e.g., erased in a "flash".

In the various read, program or erase modes, the word lines (e.g., control gates) are pulled up or down to the appropriate voltage levels by x-decoder circuitry. One portion of such circuitry, a positive-side word line decoder, pulls selected word lines up to VCC during normal read mode and to the larger positive potential (e.g., +10 VDC) during program mode, and grounds unselected word line sectors. Another portion of the circuitry, a negative-side word line decoder, pulls selected word lines down to a large negative potential (e.g., −10 VDC) during erase mode. There is no DC current path through the word lines in the various modes because the positive and negative decoding circuits never turn on at the same time.

As mentioned above, the charge on a floating gate is read by coupling the control gate to VCC and then sensing the drain current drawn by the memory cell. When there is stored negative charge (electrons) on a programmed floating gate, that negative charge should effectively increase the cell's threshold voltage so that the memory cell will not conduct when its control gate is coupled to VCC. Conversely, when a cell has been erased and unprogrammed, little or no negative charge should exist on the floating gate, meaning that the cell should conduct when its control gate is coupled to VCC. Given the diverse environments in which EPROM/flash systems can be used, these two conditions must be met for worst case values of VCC, which can vary widely. For example, while VCC is presumed to be 5 VDC for most flash memories, ±0.7 VDC variations in VCC are not unusual. Thus, a correctly programmed cell will not conduct for the highest possible VCC (+5.7 VDC), and a correctly erased cell will conduct for the lowest possible VCC (+4.3 VDC).

Consequently, there is a need for an on-chip circuit that verifies whether erased and programmed cells meet these worst-case conditions. In accordance with the present invention, this could be accomplished using on-chip circuitry that generates preset program and erase verification voltages that are at least as bad as the possible worst case voltages (i.e., 5.7 VDC and 4.3 VDC) regardless of the available VCC level. Ideally, this on-chip erase and program verification circuitry would be responsive to the signals provided by the host as part of the program/write and erase operations.

SUMMARY OF THE INVENTION

The present invention is a system for respectively verifying the program or erase status of memory cells used in EPROM/flash memory arrays.

More specifically, the present invention is an erase/program verify voltage control circuit for use in an EPROM/flash memory system that includes a plurality of memory cells that can be programmed, erased and read by a host device. This voltage control circuit includes a comparator having a first differential input that is coupled to a stable voltage reference, a second differential input that is coupled to a first circuit node and an output that changes as a function of the difference between the voltage reference and a voltage at the first node. The voltage control circuit also includes a feedback network having an input coupled to the comparator's output that is configured to respond to changes in the comparator's output by driving the first node towards the reference voltage when the reference voltage and said voltage at said first node differ. Cooperating with these two elements is a voltage divider network that maintains a second circuit node at a selectable word line supply voltage when the voltage at the first node is equal to the voltage reference. This word line supply voltage is selected from a preset program verify voltage when the host is performing a program verify operation and a preset erase verify voltage when the host is performing an erase verify operation.

The present invention is also a method for verifying flash cell erase and program operations that includes the following steps. Following the execution of a program operation, the present invention generates a worst case program verify voltage that is stable and reproducible; that program verify voltage is then output on the word lines of the flash cells just programmed. Next, the present invention determines whether any of said flash cells were turned on by the program verify voltage, which exceeds the worst case normal read condition. If some of the flash cells were turned slightly on (meaning they were not effectively programmed), the program operation is re-executed until it is verified to have been completely effective.

Following execution of an erase operation, the present invention generates a worst case erase verify voltage that is stable and reproducible. The erase verify voltage is then output on word lines of the flash cells just erased and it is then determined whether any of those flash cells are not sufficiently turned on (to make the correct logic value) by the erase verify voltage, which is below the worst case normal read condition (meaning the cells were not effectively erased). If some of the flash cells were not sufficiently turned on, the erase operation is re-executed until it is verified to have been completely effective.

Other features and advantages of the invention will appear from the following description in which the preferred embodiments have been set forth in detail in conjunction with the accompanying drawings.

DESCRIPTION OF THE PREFERRED EMBODIMENT

Figure 1:
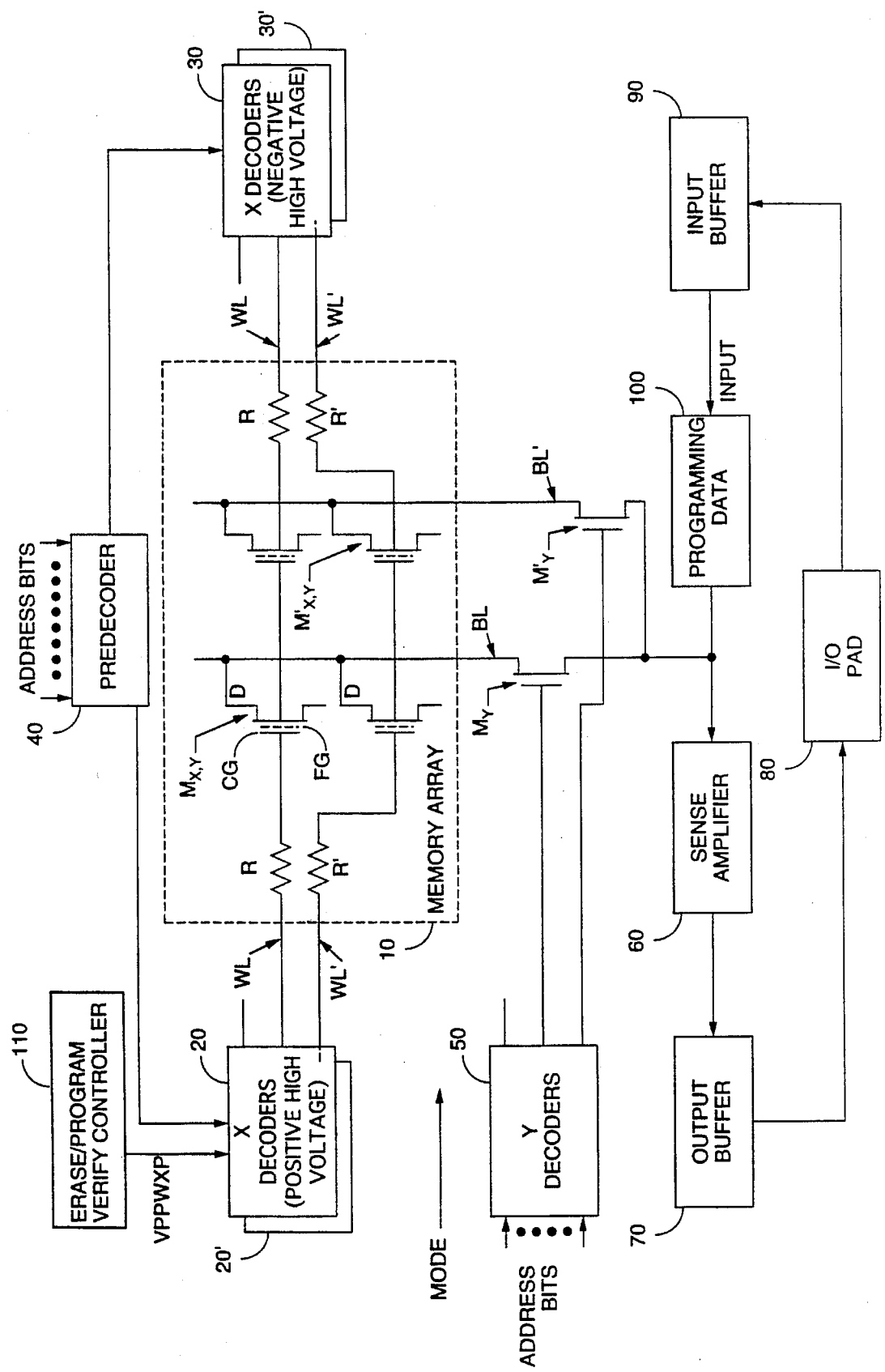
FIG. 1 is a block diagram of an EPROM/flash memory system with which the present invention may be practiced.

FIG. 1 is a block diagram of EPROM or flash memory cell architecture with which the present invention may be practiced. A memory array 10 includes a plurality of MOS memory cells such as cells $M_{x,y}$, and $M'_{x,y}$, each cell having source and drain regions, a floating gate (denoted FG) and a control gate (denoted CG). A plurality of such cells in a given horizontal (or x-axis) row have their control gates coupled together to form a word line (WL).

Each word line is selectively pulled-up or pulled-down to a program, read or erase voltage level by an x-axis positive high voltage decoder or by an x-axis negative high voltage decoder. Two word lines are shown in FIG. 1, WL being pulled-up or down by decoder 20 or 30, and word line WL' being pulled-up or down by decoder 20' or 30'. To minimize high voltage switching transients, each word line preferably includes an associated series resistance 2R of a few KΩ.

Although only two word lines are shown in FIG. 1, array 10 will include many word lines. In practice, it is common to treat groups of eight word lines as a common block, in which case there will be eight associated positive high voltage x-decoders and eight associated negative high voltage y-decoders (negative high voltage).

A predecoder 40 receives input address information from a host device such as a microprocessor computing system (not shown) and outputs appropriate signals to the decoders, e.g., 20 and 30. In turn, the appropriate decoders will pull an associated word line up or down to a necessary voltage level.

More specifically, positive high voltage x-decoder 20 pulls a selected word line WL in memory array 10 up to about +10 VDC in program/write mode, and up to VCC (e.g., ≈+5 VDC) in read mode. Negative high voltage x-decoder 30 pulls the same word line WL down to about −9 VDC in erase mode (if the word line is selected), or down to 0 VDC if unselected in erase mode or in read mode. If word line 30 is unselected, in program/write mode, decoder 30 pulls the word line down to 0 VDC. Depending upon the potential to which selected word line WL is pulled by decoder 20 or by decoder 30, information in cell $M_{x,y}$ may be read out, erased, or new information may be programmed/written into this cell.

A y-decoder 50 also receives address information from the host device. In conventional fashion, a plurality of cells in a column in the array have their source regions coupled together to form a bit line (BL). The output from the y-decoder 50 turns-on a y-axis select transistor, e.g., $M_y$, which couples the bit line signal to the input of a sense amplifier 60 that reads the stored bit of information in the address-selected cell $M_{x,y}$. If, instead, cell $M'_{x,y}$ is to be read, the y-decoder 50 will turn on the select transistor $M'_y$. For ease of illustration, only two bit lines, BL and BL', are depicted in FIG. 1 although in practice array 10 will include a great many bit lines.

In a read mode of operation, the sense amplifier output is coupled through an output buffer 70. The "0" or "1" signal stored in an addressed cell $M_{x,y}$ is then provided to an input/output pad 80, from where the information may be accessed by the host device.

Data to be stored within the array 10 is coupled to the input/output pad 80 by the host device, from where the data are coupled to an input buffer 90. The output of buffer 90 is provided to an interface 100 that provides suitable programming data for the array. The system shown in FIG. 1 also receives from the host device signals commanding either a program/write mode, erase mode, or a read mode.

After every program/write or erase operation, the host device initiates, respectively, a program or erase verification operation, which is controlled by the erase/program verify controller 110. In performing a verification operation, the controller 110 drives the word line power supply (VPP-WXP) to a different, preset, worst case value depending on whether the host has requested program or erase verification. The host device then causes the positive high-voltage x-decoders 20, 20' to read the cells just programmed or erased by outputting the worst case VPPWXP value on the appropriate word lines WL, WL'. Note that this verify read differs from the previously described normal read, where the word lines are set to VCC. This is because, if the prior erasing or programming is verified to be effective for the worst case word line voltage levels, it can be safely assumed that the erasing or programming will be effective for typical variations in VCC. The steps of the verification operation are now described in reference to FIG. 2A, for program verification, and to FIG. 2B, for erase verification.

Figure 2A:
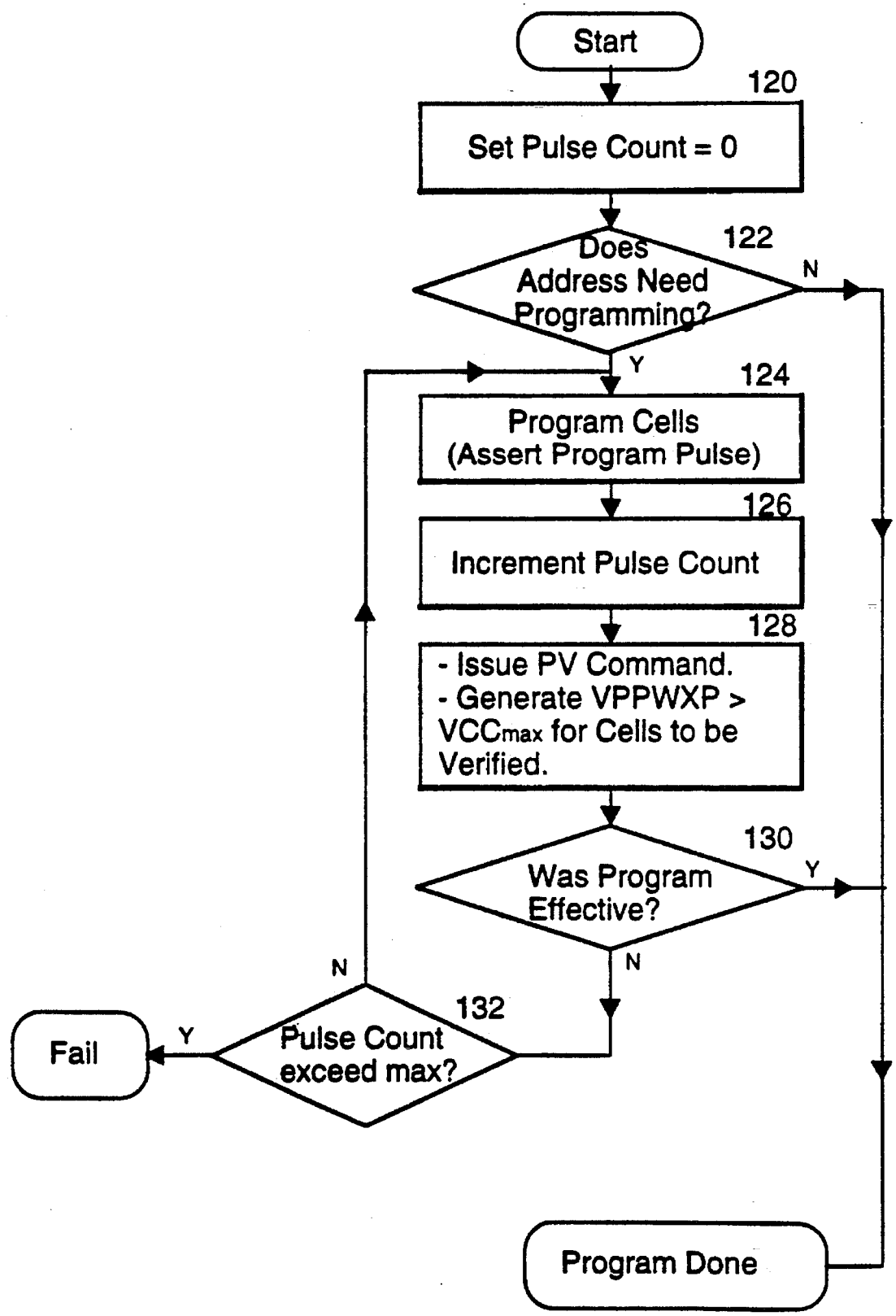
FIG. 2A is a flow chart depicting the steps of the program verification control method of the present invention.

Referring to FIG. 2A, following a program/write request for a specific address, the host device sets a program pulse counter to 0 (120). This variable is used by the host to track the number of times the program and verify cycle is attempted for a single write operation. Next, the host determines whether the cells making up that address actually need programming (122). If the data pattern is "FF", programming is not required (122-N) and the host terminates the programming operation. If the data pattern to be programmed is anything other than "FF" (122-Y), the host asserts a program pulse to program the cell (124). Once the program pulse is asserted, the host increments a program pulse counter (126). The host then initiates program verification by issuing the PV command (i.e., asserting the PV signal) (128). In response, the controller 110, using a +1.28 VDC band gap reference, generates an appropriate worst case VCC voltage (e.g., +6.4 VDC) that is substantially greater than $VCC_{max}$ (e.g., +5.7 VDC) and places that voltage on the VPPWXP line (128). This VPPWXP voltage is then mirrored by the appropriate x-decoder 20 to the word line of the memory cells whose programming needs to be verified. In the preferred embodiment, these are the memory cells that were just programmed by the host (i.e., these cells share the same word and bit lines as the cells just programmed).

After the worst case VCC is placed on the word line, the sense amplifier 60 determines whether the cells were effectively programmed (which is the case if the programmed cells were not turned on by the worst case VPPWXP) (130). If any of the cells were not effectively programmed (130-N) and the pulse count has not exceeded its limit (132-N), the host device repeats the program then verify process from the beginning (124). In the preferred embodiment, the pulse count program limit is 25. If the pulse count exceeds this limit (132-Y), the host terminates the program operation and declares that the part being programmed has failed. This program then verify process repeats until the host determines that all of the cells have been correctly programmed (130-Y).

Figure 2B:
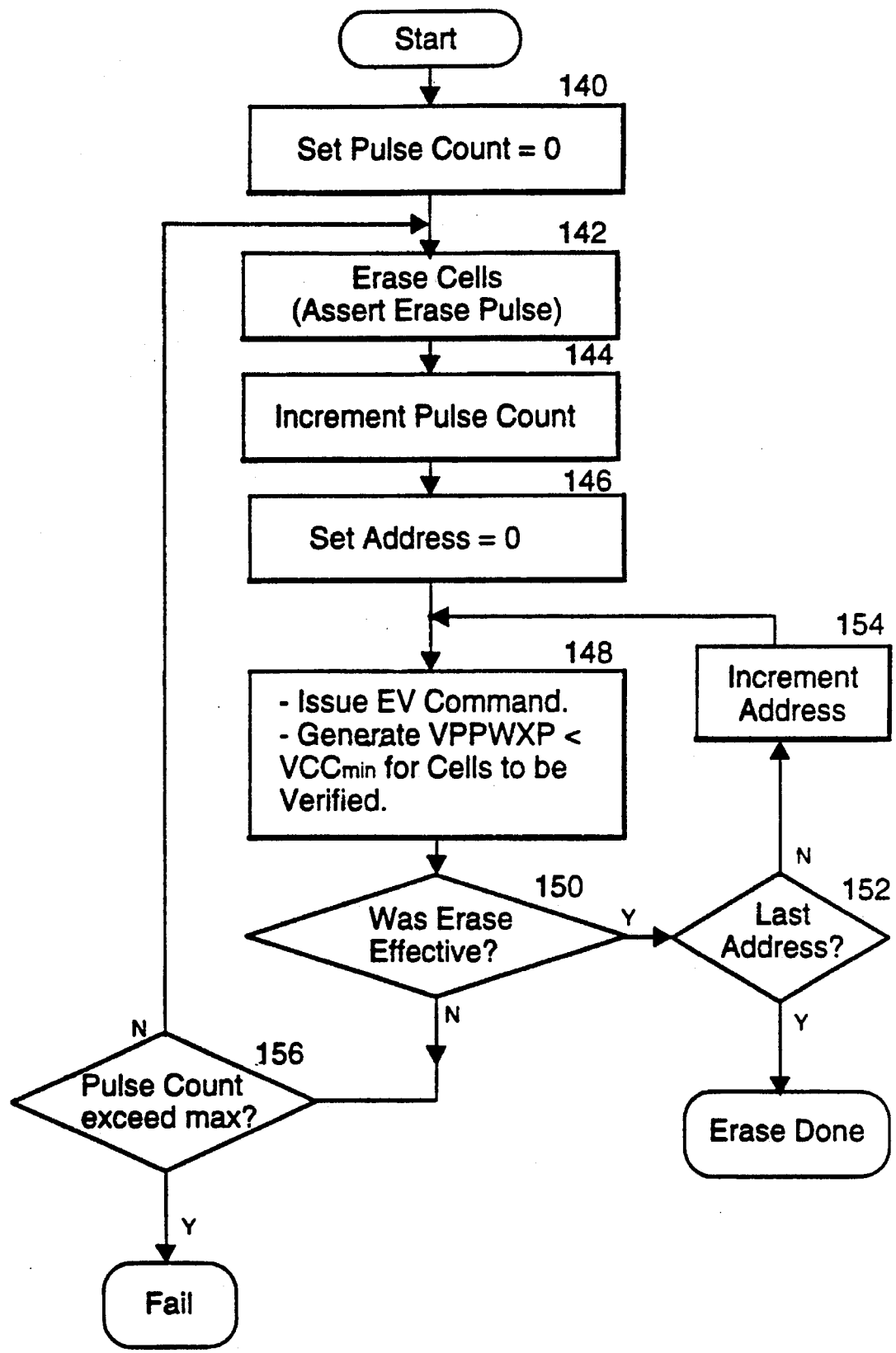
FIG. 2B is a flow chart depicting the steps of the erase verification control method of the present invention.

Referring to FIG. 2B, at the beginning of an erase operation, the host device sets an erase pulse count variable to zero (140). Similar to the program pulse count variable, the erase pulse counter is used by the host to keep track of the number of erase then verify cycles for a requested erase operation. In the preferred embodiment, the number of erase/verify cycles allowed before the host declares failure is large (1000 times) in comparison to the number of repeats allowed for a program/verify operation. This is because, in the erase situation, entire sectors of a flash memory are erased whereas, in the program case, individual addresses are programmed then verified. After setting the pulse counter, the host asserts an erase pulse to erase the appropriate sectors (142), increments the pulse counter (144) and proceeds to verify, address by address, the preceding erase operation.

As the first step of an erase verify operation, the host sets an address variable to 0 so as to access the first address of the sector just erased (146). The host device then issues an erase verify command for the cells making up that address by asserting the erase verify (EV) signal (148). In response, the controller 110 generates a worst case VCC erase voltage (e.g., approximately +4.0 VDC) and places that voltage on the VPPWXP line, ultimately to be mirrored to the word lines of the memory cells which were just erased (148). This worst case erase verify voltage is selected to be significantly lower than the typical lowest VCC voltage, $VCC_{min}$ (in the preferred embodiment, approximately +4.3 VDC). The sense amplifier 60 then determines whether the cells were effectively erased (which is the case if all of the erased cells conduct when their gates are tied to the worst case VPPWXP) (150). If any of the cells do not conduct, indicating they were inadequately erased (150-N), the host device determines whether the erase pulse counter exceeds the preset repeat limit (e.g., 1000) for erase/verify cycles (156). If the erase pulse counter does not exceed the limit (156-N), the host repeats the previous erase/verify operation from the initial step (142) (i.e., without resetting the erase pulse counter). If the erase pulse counter exceeds the limit (156-Y), the host terminates the erase operation and indicates that the operation was a failure. If all of the cells of the current address were adequately erased (150-Y), the host determines whether the last address in the sector has been verified (152). If all addresses have been verified (152-Y), the erase operation was successful and can be terminated by the host. If more addresses remain to be verified (152-N), the host increments the address (154) and verifies the status of the next address (148).

Note that in most flash memory systems, the erase verify operation will precede the program verify operation. The result of either operation is evaluated by the sense amplifier 60 as in any other memory read operation.

Figure 3:
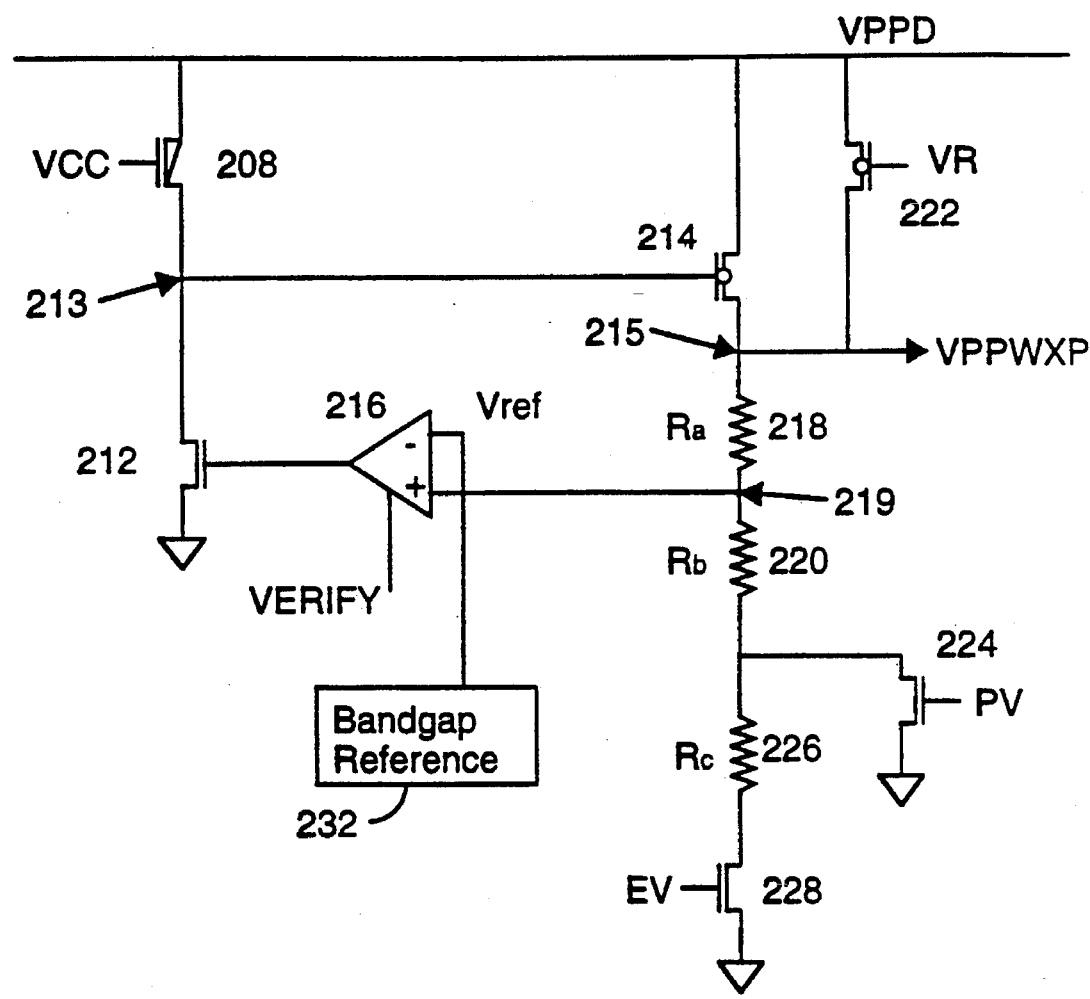
FIG. 3 is a block diagram of the program and erase verification control circuitry of the present invention.

FIG. 3 shows a block diagram of the program and erase verification circuitry of the present invention, whose role in the verification operation is to respond to the host's PV and EV signals by supplying the preset word line supply voltages that are used to verify prior memory cell program and erase operations.

The controller 110 includes a p-channel transistor 208, three n-channel transistors 212, 224 and 228, and a n-channel, native transistor 214. Also included in the controller 110 are a comparator 216 and three resistors 218, 220 and 226. External power inputs to the controller circuitry 110 include VCC (approx. +5 VDC), VPPD (program verify power supply, equaling $VPP-V_{threshold}$, or approx. 10–12 VDC) and VREF (derived from the band gap reference 232 and equaling +1.28 VDC). Control signals from the host include EV (Erase Verify) and PV (Program Verify), both of which have been described above, and Verify (a signal that enables the verification circuitry and which is the sum of EV and PV). The controller's output 215 is coupled to the word line driver power supply (VPPWXP), which drives the word lines WL and WL' through the circuitry of FIG. 1. Also coupled to the VPPWXP line, but not a part of the controller circuitry 110, is a second n-channel native transistor 222. The operation of these elements is now described, first, for program verification, then for erase verification.

As already described, the host device initiates a program verify operation by asserting the PV signal, which is coupled to the gate of the transistor 224. When this signal is asserted, the transistor 224 turns on, creating a path from VPPD to ground through the n-channel native transistor 214, the two resistors 218, and the transistor 224. Note that there is no path to VPPD through the p-channel transistor 208 as the gate of that transistor 208 is coupled to VCC. Also, because the host never simultaneously asserts the EV and PV signals, the transistor 228 is inactive while PV is high.

As long as the PV signal is asserted, the controller 110 is required to maintain its output on the VPPWXP node 215 at approximately 6.4 VDC, which is the program verification voltage level. This is accomplished primarily through the comparator 216, one input of which is coupled to the reference voltage (Vref, 1.28 VDC) derived from the bandgap reference 232, the other input of which is coupled to the output node 219 ($V_{219}$) of the voltage divider network that consists of the resistors 218 and 220 (note: the resistor 226 does not come into play during program verification as the transistor 228 is off). Given this configuration, it should be apparent to one skilled in the art that the voltage at the node 219 is given by equation (1), wherein "Ra" and "Rb" denote the resistance of the resistors 218 and 220, respectively.

$$VPPWXP = V_{219} \frac{R_a + R_b}{R_b} \qquad (1)$$
$$= V_{ref} \frac{R_a + R_b}{R_b}$$

Using equation (1), the resistor values $R_a$ and $R_b$ are selected so that, when VPPWXP is at 6.4 VDC (the target program verify voltage), $V_{219}$ will be at 1.28 VDC (i.e., Vref). For example, in the preferred embodiment, $R_a$ is 80 kΩ and $R_b$ is 20kΩ. With appropriate values for $R_a$ and $R_b$, when VPPWXP deviates from 6.4 volts, $V_{219}$ will also vary from Vref. As a result of this variation at one of its inputs, the comparator's output will vary, which variation is used by the feedback elements, including the pulldown transistor 212, the native transistor 214 and the resistors 218, 220, to drive $V_{219}$ towards Vref and, by extension, VPPWXP towards 6.4 VDC.

For example, when $V_{219}$ is more positive than Vref, the comparator 216 generates a higher output to the gate of the transistor 212, which as a result tends to pull the node 213 down more strongly. This provides less drive the native transistor 214 and VPPWXP rises. Conversely, when $V_{219}$ is less positive than Vref, the comparator 216 generates a lower output to the gate of the transistor 212, which turns on less strongly, allowing the voltage at the node 213 to rise. This causes the native transistor 214 to turn on more strongly, pulling up VPPWXP. In this way, the controller 110 is able to maintain VPPWXP at approximately 6.4 VDC during a program verify operation.

As mentioned above, when PV is asserted, EV is not asserted and vice versa. Consequently, when the host asserts the EV signal (to initiate an erase verify operation), the transistor 224 turns on, creating a path from VPPD to ground through the native transistor 214, the three resistors 218, 220, 226, and the transistor 228. As above, there is no path to VPPD through the p-channel transistor 208 as the gate of that transistor 208 is coupled to VCC. Also, because the host never simultaneously asserts the EV and PV signals, the transistor 224 is inactive while EV is high.

As long as the EV signal is asserted, the controller 110 is required to maintain VPPWXP at approximately 4.0 VDC, which is the erase verification voltage level. As above, this is accomplished primarily through the comparator 216, one input of which is coupled to the reference voltage (Vref, 1.28 VDC) derived from the bandgap reference 232, and the voltage divider network, consisting of the resistors 218, 220, 226, whose output 219 is coupled to the other input of the comparator 216. It should be apparent to one skilled in the art that the voltage at the node 219 is given by equation (2), wherein "$R_a$", "$R_b$" and "$R_c$" denote the resistance of the resistors 218, 220 and 226, respectively.

$$VPPWXP = V_{219} \frac{R_a + R_b + R_c}{R_b + R_c} \qquad (2)$$
$$= V_{ref} \frac{R_a + R_b + R_c}{R_b + R_c}$$

Using the previously established resistance values $R_a$ and $R_b$ and equation (2), the resistor value $R_c$ is selected so that, when VPPWXP is at approximately 4.0 VDC (the target erase verify voltage), $V_{219}$ will be at 1.28 VDC (i.e., Vref). For example, in the preferred embodiment, with $R_a$ at 80 kΩ and $R_b$ at 20kΩ, $R_c$ is 15kΩ. Using these resistances, VPPWXP and $V_{219}$ are maintained through the same feedback process at 4.0 VDC and 1.28 VDC, respectively.

The comparator 216 is only active when the Verify signal provided by the host device is asserted. Consequently, when the host device is done verifying an erase or program operation, it deasserts the Verify signal, as a result of which the comparator 216 is powered down. When the comparator is powered down, its output goes high, which causes the n-channel transistor 212 to turn on and pull down the node 213. As a result, the transistor 214 is turned off. Thus, when Verify is deasserted, all of the elements of the circuit 110 are turned off.

Additionally, during normal operation of the memory array, the VR signal, which is coupled to the gate of the native transistor 222, is pumped up to about 7–8 VDC, meaning that the source voltage of the transistor 222 will be higher than the worse case VPPWXP generated for program verification. Consequently, during normal operation, the controller 110 will have no effect on VPPWXP.

Modifications and variations may be made to the disclosed embodiments without departing from the subject and spirit of the invention as defined by the following claims.

What is claimed is:

1. An erase/program verify voltage control circuit for use in an EPROM/flash memory system that includes a plurality of memory cells that can be programmed, erased and read by a host device, said voltage control circuit comprising:

a comparator having a first differential input that is coupled to a stable voltage reference and a second differential input that is coupled to a first circuit node; said comparator changing its output as a function of differences between said voltage reference and a voltage at said first node;

a feedback network having an input coupled to said comparator's output, said feedback network being configured to respond to changes in said comparator's output by driving said first node towards said reference voltage when said reference voltage and said voltage at said first node differ; and a voltage divider network that maintains a second circuit node at a selectable word line supply voltage when said first node is equal to said voltage reference, said word line supply voltage being selected from a preset program verify voltage when said host is performing a program verify operation and a preset erase verify voltage when said host is performing an erase verify operation.

2. The erase/program verify voltage control circuit of claim 1, wherein said voltage reference is derived from a bandgap reference.

3. The erase/program verify voltage control circuit of claim 2, wherein said voltage reference is approximately 1.28 VDC.

4. The erase/program verify voltage control circuit of claim 1, wherein said preset program verify voltage is higher than a worst case high VCC and said preset erase verify voltage is lower than a worst case low VCC.

5. The erase/program verify voltage control circuit of claim 4, wherein said worst case high VCC is approximately 5.7 VDC and said worst case low VCC is approximately 4.3 VDC.

6. The erase/program verify voltage control circuit of claim 5, wherein said preset program verify voltage is approximately 6.4 VDC and said preset erase verify voltage is approximately 4.0 VDC.

7. The erase/program verify voltage control circuit of claim 1, wherein said voltage divider network comprises:

a first resistor having a first resistance, said first resistor being connected between said first circuit node and said second circuit node;

a second resistor having a second resistance, said second resistor being connected between said first circuit node and a third circuit node;

a first n-channel transistor having a drain connected to said third node a source connected to a circuit ground node and a gate coupled to a program verify signal provided by said host, said host asserting said program verify signal when performing said program verify operation, as a result turning on said first transistor; and a third resistor having a third resistance, said third resistor being connected between said third circuit node and the drain of a second n-channel transistor;

said second n-channel transistor having a source connected to said circuit ground node and a gate coupled to an erase verify signal provided by said host, said host asserting said erase verify signal when performing said erase verify operation, as a result turning on said second transistor;

said respective resistances being determined so that, when said program verify signal is asserted, said second node will be at said preset program verification voltage and, when said erase verify signal is asserted, said second node will be at said preset erase verify signal, said erase and program verify signals never being asserted simultaneously.

8. The erase/program verify voltage control circuit of claim 1, wherein said comparator is configured to drive said output lower when a voltage at said first node is greater than said voltage reference and to drive said output higher when said first node voltage is smaller than said voltage reference.

9. The erase/program verify voltage control circuit of claim 1, wherein said comparator is enabled by a VERIFY signal asserted by said host when said host is performing one of said verification operations, such that, when said VERIFY signal is deasserted by said host, said comparator and said voltage control circuit are turned off.

10. A method for verifying flash cell erase and program operations comprising the steps of:

(1) following execution of said program operation:
   (a) generating a worst case program verify voltage that is stable and reproducible;
   (b) outputting said program verify voltage on word lines of flash cells just programmed;
   (c) determining whether any of said flash cells were turned on by said program verify voltage;
   (d) after determining that some of said flash cells were turned on, re-executing said program operation and repeating steps (1)(a) through (1)(d) of said method; and (2) following execution of said erase operation:
   (a) generating a worst case erase verify voltage that is stable and reproducible;
   (b) outputting said erase verify voltage on word lines of flash cells just programmed;
   (c) determining whether any of said flash cells were not turned on by said program verify voltage; and
   (d) after determining that some of said flash cells were not turned on, re-executing said erase operation and repeating steps (2)(a) through (2)(d) of said method.

11. The method of claim 10, wherein said program verify voltage and said erase verify voltage are generated from a bandgap reference.

12. The method of claim 11, wherein said voltage reference is approximately 1.28 VDC.

13. The method of claim 10, wherein said program verify voltage is higher than a worst case high VCC and said preset erase verify voltage is lower than a worst case low VCC, said worst case high and low VCCs representing worst case voltages that could be placed on said word lines to read, respectively, programmed and erased flash cells during normal use of said memory system.

14. The method of claim 13, wherein said worst case high VCC is approximately 5.7 VDC and said worst case low VCC is approximately 4.3 VDC.

15. The method of claim 14, wherein said program verify voltage is approximately 6.4 VDC and said erase verify voltage is approximately 4.0 VDC.

16. A method for verifying flash cell erase operations comprising the steps of:

following execution of said erase operation:
   (a) generating a worst case erase verify voltage that is stable and reproducible;
   (b) outputting said erase verify voltage on word lines of flash cells just programmed;
   (c) determining whether any of said flash cells were not turned on by said program verify voltage; and
   (d) after determining that some of said flash cells were not turned on, re-executing said erase operation and repeating steps (a) through (d) of said method.

17. A method for verifying flash cell program operations comprising the steps of:

following execution of said program operation:
   (a) generating a worst case program verify voltage that is stable and reproducible;
   (b) outputting said program verify voltage on word lines of flash cells just programmed;
   (c) determining whether any of said flash cells were turned on by said program verify voltage; and
   (d) after determining that some of said flash cells were turned on, re-executing said program operation and repeating steps (a) through (d) of said method.

* * * * *